United States Patent
Kalluru et al.

(10) Patent No.: US 9,369,115 B2
(45) Date of Patent: Jun. 14, 2016

(54) VOLTAGE DOUBLER AND NONVOLATING MEMORY DEVICE HAVING THE SAME

(71) Applicant: SAMSUNG ELECTRONICS CO., LTD., Suwon-Si, Gyeonggi-Do (KR)

(72) Inventors: Vivek Venkata Kalluru, Suwon-Si (KR); Youngsun Min, Hwaseong-Si (KR); Hichoon Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/637,670

(22) Filed: Mar. 4, 2015

(65) Prior Publication Data

US 2015/0288353 A1    Oct. 8, 2015

(30) Foreign Application Priority Data

Apr. 7, 2014    (KR) .................. 10-2014-0041163

(51) Int. Cl.
| | |
|---|---|
| *G11C 16/00* | (2006.01) |
| *H03K 5/02* | (2006.01) |
| *G11C 16/04* | (2006.01) |
| *G11C 16/08* | (2006.01) |
| *G11C 16/26* | (2006.01) |
| *G11C 16/32* | (2006.01) |

(52) U.S. Cl.
CPC ............ *H03K 5/023* (2013.01); *G11C 16/0466* (2013.01); *G11C 16/0483* (2013.01); *G11C 16/08* (2013.01); *G11C 16/26* (2013.01); *G11C 16/32* (2013.01); *Y10T 29/49169* (2015.01)

(58) Field of Classification Search
CPC .......... G11C 16/0483; G11C 16/0466; G11C 16/08; G11C 16/26; G11C 16/32; H03K 5/023; Y10T 29/49169

USPC ............ 365/185.12, 185.23, 189.09, 189.11, 365/226

See application file for complete search history.

(56) References Cited

U.S. PATENT DOCUMENTS

| | | | |
|---|---|---|---|
| 7,602,233 | B2 | 10/2009 | Pietri et al. |
| 7,724,073 | B2 | 5/2010 | Kim et al. |
| 7,855,591 | B2 | 12/2010 | Racape |
| 7,977,984 | B1 | 7/2011 | D'Souza et al. |
| 8,049,553 | B2 | 11/2011 | Kim et al. |

(Continued)

FOREIGN PATENT DOCUMENTS

| | | |
|---|---|---|
| KR | 1020090071860 A | 7/2009 |
| KR | 1020100028193 A | 3/2010 |

OTHER PUBLICATIONS

Roberto Pelliconi et al., "Power Efficient Charge Pump in Deep Submicron Standard CMOS Technology", IEEE Journal of Solid-State Circuits, vol. 38, No. 6, Jun. 2003, pp. 1068-1071.

(Continued)

*Primary Examiner* — Tan T. Nguyen
(74) *Attorney, Agent, or Firm* — Volentine & Whitt, PLLC

(57) ABSTRACT

A voltage doubler includes first to fourth transistors, a first capacitor connected between a first node and a first clock terminal configured to receive a first clock signal. A second capacitor is connected between a second node and a second clock terminal configured to receive an inverted first clock signal. A first gate control unit is configured to control the first and second transistors using the first clock signal and the inverted first clock signal, and a second gate control unit is configured to control the third and fourth transistors using a second clock signal and an inverted second clock signal. A load capacitor is connected between the output terminal and a ground terminal.

20 Claims, 6 Drawing Sheets

(56) References Cited

U.S. PATENT DOCUMENTS

| | | |
|---|---|---|
| 8,362,824 B2 | 1/2013 | Wong et al. |
| 8,378,737 B2 | 2/2013 | Ker et al. |
| 8,421,524 B2 | 4/2013 | Pan et al. |
| 2007/0223289 A1* | 9/2007 | Lee .................. G11C 16/12 365/189.11 |
| 2009/0302930 A1 | 12/2009 | Pan et al. |
| 2013/0162159 A1 | 6/2013 | Kim et al. |
| 2013/0257522 A1 | 10/2013 | Daigle et al. |

OTHER PUBLICATIONS

L. Gobbi et al., "High-Efficiency CMOS Charge Pump", IEEE International Conference on Electronics, Circuits and Systems, Dec. 2006, pp. 724-727.

Pierre Favrat et al., "A High-Efficiency CMOS Voltage Doubler", IEEE Journal of Solidstate Circuits, vol. 33, No. 3, Mar. 1998, pp. 410-416.

* cited by examiner

VOLTAGE DOUBLER AND NONVOLATING MEMORY DEVICE HAVING THE SAME

CROSS-REFERENCE TO RELATED APPLICATIONS

This U.S. non-provisional patent application claims priority under 35 U.S.C. §119 to Korean Patent Application No. 10-2014-0041163 filed Apr. 7, 2014, the subject matter which is hereby incorporated by reference.

BACKGROUND

The inventive concept relates to a voltage doubler and a nonvolatile memory device including the same. Semiconductor memory devices may be volatile or nonvolatile. A nonvolatile semiconductor memory device may retain data stored therein even at power-off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries.

SUMMARY

One aspect of embodiments of the inventive concept is directed to provide a voltage doubler comprising a first transistor connected between a first node and an input terminal receiving an input voltage, a second transistor connected between the input terminal and a second node, and a third transistor connected between the first node and an output terminal outputting an output voltage. A fourth transistor is connected between the second node and the output terminal, and a first capacitor is connected between the first node and a first clock terminal receiving a first clock signal. A second capacitor is connected between the second node and a second clock terminal receiving an inverted first clock signal, and a first gate control unit is configured to control the first and second transistors using the first clock signal and the inverted first clock signal. A second gate control unit is configured to control the third and fourth transistors using a second clock signal and an inverted second clock signal, and a load capacitor is connected between the output terminal and a ground terminal.

Another aspect of embodiments of the inventive concept is directed to provide a nonvolatile memory device comprising: a memory cell array including a plurality of memory blocks each formed of a plurality of memory cells; an address decoder configured to select one of the plurality of memory blocks; a voltage generation circuit configured to provide a word line voltage to word lines of the selected memory block; an input/output circuit configured to store page data to be programmed at a selected page of the selected memory block at a program operation and store data read from the selected page of the selected memory block at a read operation; and a control circuit configured to control the address decoder, the voltage generation circuit, and the input/output circuit. The voltage generation circuit comprises a voltage doubler that includes: a first transistor connected between an input terminal, receiving an input voltage, and a first node; a second transistor connected between the input terminal and a second node; a third transistor connected between the first node and an output terminal outputting an output voltage; a fourth transistor connected between the second node and the output terminal; a first capacitor connected between the first node and a first clock terminal receiving a first clock signal; a second capacitor connected between the second node and a second clock terminal receiving an inverted first clock signal; a first gate control unit configured to control the first and second transistors using the first clock signal and the inverted first clock signal; a second gate control unit configured to control the third and fourth transistors using a second clock signal and an inverted second clock signal; and a load capacitor connected between the output terminal and a ground terminal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
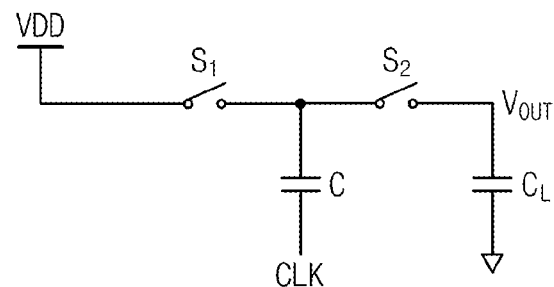
FIG. 1 is a diagram schematically illustrating a voltage doubler model having a load capacitor and ideal switches.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A ramp-up time of a charge pump unit according to an embodiment of the inventive concept is shorter than that of a cross-coupled charge pump. Here, the ramp-up time is a time taken for an output voltage to reach a target level. The charge pump unit of the inventive concept may improve a current driving capacity and pumping efficiency at an initial operation without an increase in an area, thereby overcoming problems such as a low current driving capacity and a great on-resistance. Below, the charge pump unit is referred to as a voltage doubler.

To understand a fast ramp-up operation of the charge pump unit according to an embodiment of the inventive concept, there may be a need to derive ramp-up time equations of an ideal voltage doubler formed of ideal charge transfer switches. Non-ideality may be added to the ramp-up time equations to understand how on-resistances of the charge transfer switches affect the ramp-up time.

FIG. 1 is a diagram schematically illustrating a typical voltage doubler model having a load capacitor and ideal switches. Referring to FIG. 1, half of a voltage doubler charges the load capacitor $C_L$. When a switch $S_1$ is turned on, a top plate of a pump capacitor C is charged with a power supply voltage VDD. The pump capacitor C is connected to the load capacitor $C_L$ when a switch $S_2$ is turned on. A bottom plate of the pump capacitor C is charged with the power supply voltage VDD at the same time when the switch $S_2$ is turned on. The load capacitor $C_L$ is charged with an initial voltage V1 through charge sharing between the pump capacitor and the load capacitor $C_L$. Here, it is assumed that the switches $S_1$ and $S_2$ are ideal switches. An output voltage $V_{OUT}$ may be expressed by the following equation (1).

$$V_{OUT} = 2VDD\left(1 - \left(\frac{C_L}{C + C_L}\right)\right) \quad (1)$$

The following equation (2) shows an output voltage $V_{OUT}$ in case the voltage doubler operates during "n" clock cycles.

$$V_n = 2VDD\left(1 - \left(\frac{C_L}{C + C_L}\right)^n\right) \quad (2)$$

Thus, a step voltage $V_{stepn}$ may be expressed by the following equation (3).

$$V_{stepn} = v_n - v_{n-1} = V_n = 2VDD\left(\frac{C_L}{C + C_L}\right)^n \left(\frac{c}{c_l}\right) \quad (3)$$

The load capacitor $C_L$ is charged with decreasing steps to its final value 2VDD. With the equation (3), the step voltage $V_{stepn}$ decreases in proportion to an increase in "n".

The pump unit may necessitate cycles infinitely to reach the last value 2VDD. It is assumed that a voltage $V_F$ is a target voltage of the voltage doubler. The following equation (4) may be derived from the equation (2) and indicate the number (n) of clock cycles that the pump unit necessitates until an output of the pump unit reaches the target value $V_F$ of the voltage doubler.

$$n = \frac{\ln\left(1 - \frac{V_F}{2VDD}\right)}{\ln\left(\frac{C_L}{C + C_L}\right)} \quad (4)$$

A ramp-up time of the pump unit may be obtained from the equation (4) by multiplying a time, corresponding to half a clock cycle, by "n".

Figure 2:
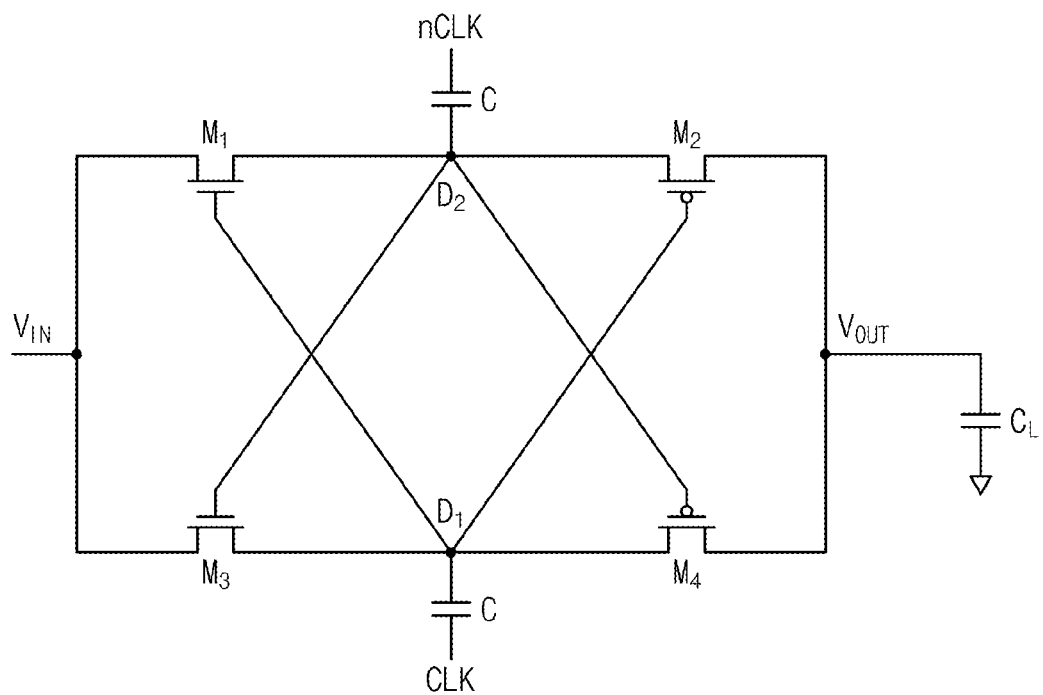
FIG. 2 is a diagram schematically illustrating a typical cross-coupled voltage doubler.

FIG. 2 is a diagram schematically illustrating a cross-coupled voltage doubler. Referring to FIG. 2, gates of pass transistors $M_1$ to $M_4$ may be driven by the other half of a pump unit. If $C_L \gg C$, nodes D1 and D2 are reset to a very low value due to charge sharing of a load capacitor $C_L$. Overdrive voltages of the pass transistors $M_1$ to $M_4$ may be very low during an initial ramp-up operation of the pump unit; therefore, on-resistances of all switches increase. An on-resistance of a switch is not negligible compared to a time period of a clock during an initial ramp-up condition. As the nodes $D_1$ and $D_2$ build to higher values in subsequent clock cycles, the on-resistance decreases every clock cycle. In this case, a rising time equation derived from the equation (4) is invalid for FIG. 2.

Figure 3:
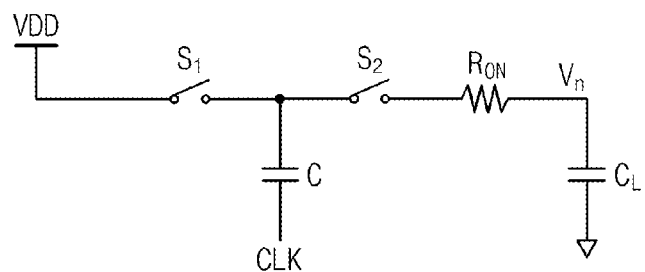
FIG. 3 is a diagram schematically illustrating a voltage doubler having a resistance switch.

Now, an on-resistance effect of the pass transistors $M_1$ to $M_4$ will be described. FIG. 3 is a diagram schematically illustrating a voltage doubler having a resistance switch. In FIG. 3, assuming that $C_L \gg C$ and $R_{ON}$ is constant during all clock cycles, the last value $V_n$ after "n" clock cycles may be expressed by the following equation (5).

$$V_n = 2VDD\left(1 - \left(\frac{C_L}{C+C_L}\right)^n\right)\left(1 - e^{\frac{T}{R_{ON}C}}\right) \quad (5)$$

Here, "$R_{ON}$" is an on-resistance of a PMOS pass transistor, and "T" is a time corresponding to one-half the period of a clock. However, the on-resistance $R_{ON}$ varies every clock cycle according to the following equation (6).

$$R_{ONt} = \frac{1}{\beta(V_{gsi} - Vt)} \quad (6)$$

Here, "$R_{ONi}$" is an on-resistance at an ith clock cycle. As voltages of nodes $D_1$ and $D_2$ shown in FIG. 2 gradually increase, an overdrive voltage of a PMOS pass transistor gradually increases. That is, "$R_{ONi}$" decreases every clock cycle. Considering a variation in $R_{ON}$, "$V_n$" may be expressed by the following equation (7).

$$V_n = 2VDD(1-a)\sum_{i=1}^{n} a^{n-i}\left(1 - e^{\frac{T}{R_{ON}C}}\right) \quad (7)$$

In the equation (7), "a" is $C_L/(C+C_L)$.

"$R_{ONi}$" may depend on the nodes $D_1$ and $D_2$ in turns. As "$R_{ONi}$" becomes close to "0", the equation (7) is changed into the equation (2). It is understood from the equations (2) and (7) that resistances of switches affect a ramp-up time. Once the pump reaches the final voltage, assuming the switches are properly sized, the switch resistance has no effect because overdrive voltages of the switches may be sufficiently high to make it negligible.

Figure 4:
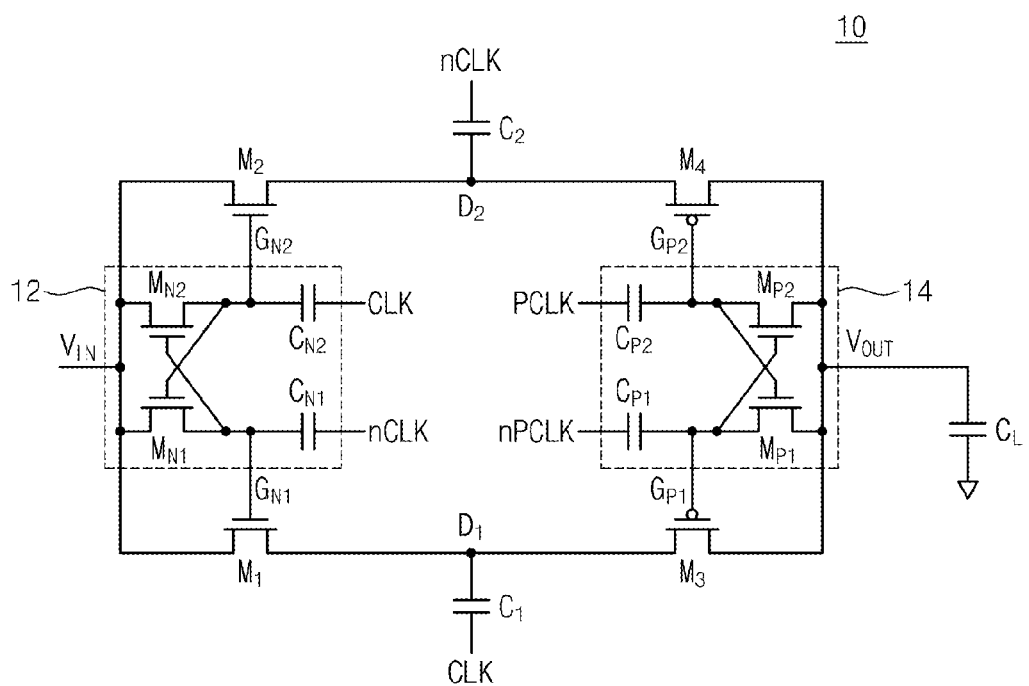
FIG. 4 is a diagram schematically illustrating a pump unit according to an embodiment of the inventive concept.

FIG. 4 is a diagram schematically illustrating a pump unit according to an embodiment of the inventive concept. Referring to FIG. 4, a voltage doubler 10 includes pass transistors $M_1$ to $M_4$, doubler capacitors $C_1$ and $C_2$, a first gate control unit 12, and a second gate control unit 14.

The first transistor $M_1$ is connected between a first node $D_1$ and an input terminal for receiving an input voltage $V_{IN}$, and the second transistor $M_2$ is connected between a second node $D_2$ and the input terminal $V_{IN}$. The third transistor M3 is connected between the first node $D_1$ and an output terminal for outputting an output voltage $V_{OUT}$. The fourth transistor $M_4$ is connected between the second node $D_2$ and the output terminal $V_{OUT}$. The first capacitor $C_1$ is connected between the first node $D_1$ and a first clock terminal receiving a first clock signal CLK. The second capacitor $C_2$ is connected between the second node $D_2$ and a second clock terminal receiving an inverted version of the first clock signal (hereinafter, referred to as an inverted first clock signal nCLK). The first gate control unit 12 controls the first and second transistors $M_1$ and $M_2$ using the first clock signal CLK and the inverted first clock signal nCLK. The second gate control unit 14 controls the third and fourth transistors $M_3$ and $M_4$ using a second clock signal PCLK and an inverted version of the second clock signal (hereinafter, referred to as an inverted second clock signal nPCLK). The load capacitor $C_L$ is connected between the output terminal $V_{OUT}$ and a ground terminal.

The pass transistors $M_1$ and $M_2$ may be controlled by the first gate control unit 12 that is formed of boosting capacitors $C_{N1}$ and $C_{N2}$ and NMOS transistors $M_{N1}$ and $M_{N2}$. The boosting capacitors $C_{N1}$ and $C_{N2}$ are connected to gates $G_{N1}$ and $G_{N2}$ of the pass transistors $M_1$ and $M_2$ and receive the first clock signal CLK and the inverted first clock signal nCLK. The NMOS transistors $M_{N1}$ and $M_{N2}$ are cross-coupled between the gates $G_{N1}$ and $G_{N2}$ of the pass transistors $M_1$ and $M_2$ and the input terminal $VI_N$.

It will now be described how an on-resistance decreases. It is assumed that all nodes are reset to 0 V. The gate $G_{N2}$ of the pass transistor $M_2$ has a power supply voltage VDD when the first clock signal CLK has a high level. Since the pass transistor $M_2$ is turned on, the node D2 is charged with (VDD−Vt). When the inverted first clock signal nCLK has a high level and the second clock signal PCLK has a low level, the node $D_2$ is connected to the output terminal VOUT via the pass transistor $M_4$ with a high $V_{GS}$ voltage. The reason is that a gate $G_{P2}$ of the pass transistor $M_4$ is pulled up to the power supply voltage VDD. Thus, on-resistances of the pass transistors $M_2$ and $M_4$ decrease from a first clock cycle.

Similarly, the pass transistors $M_3$ and $M_4$ are controlled by the second gate control unit 14 that is formed of boosting capacitors $C_{P1}$ and $C_{P2}$ and PMOS transistors $M_{P1}$ and $M_{P2}$. The boosting capacitors $C_{P1}$ and $C_{P2}$ are connected to gates $G_{P1}$ and $G_{P2}$ of the third and fourth transistors $M_3$ and $M_4$ and receive the second clock signal PCLK and the inverted second clock signal nPCLK. The PMOS transistors $M_{P1}$ and $M_{P2}$ are cross-coupled between the gates of the third and fourth transistors $M_3$ and $M_4$ and the output terminal $V_{OUT}$. On-resistances of the pass transistors $M_1$ and $M_3$ decrease at an initial pump ramp-up operation. If parasitic current and reverse current don't exist, a pump unit is formed according to the equation (2).

A pump unit implemented with a cross-coupled doubler shown in FIG. 2 may be based on the equation (5). Making a ramp-up time of a pump unit bad, an on-resistance is not negligible. A voltage doubler 10 according to an embodiment of the inventive concept maintains high overdrive voltages from a first clock cycle, thereby reducing resistances of PMOS and NMOS pass transistors.

Figure 5:
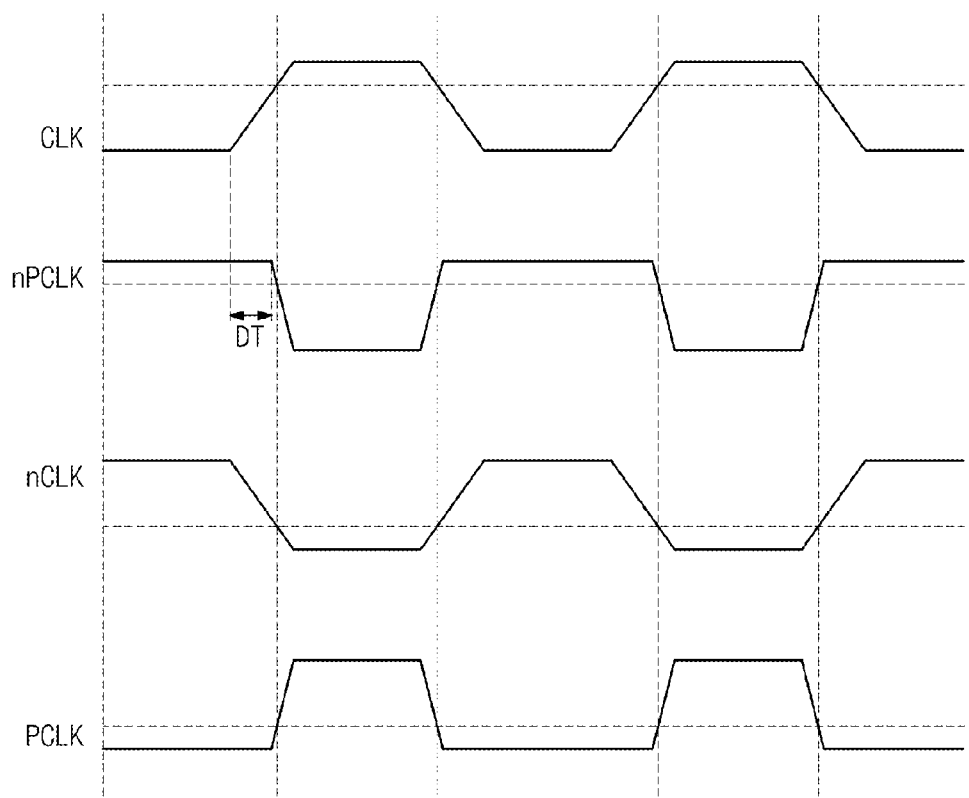
FIG. 5 is a diagram showing a relation between CLK and PCLK according to an embodiment of the inventive concept.

FIG. 5 is a diagram showing a relation between CLK and PCLK according to an embodiment of the inventive concept. Referring to FIG. 5, PCLK is a clock that is obtained by delaying an inverted clock nCLK by a predetermined time DT.

Figure 6:
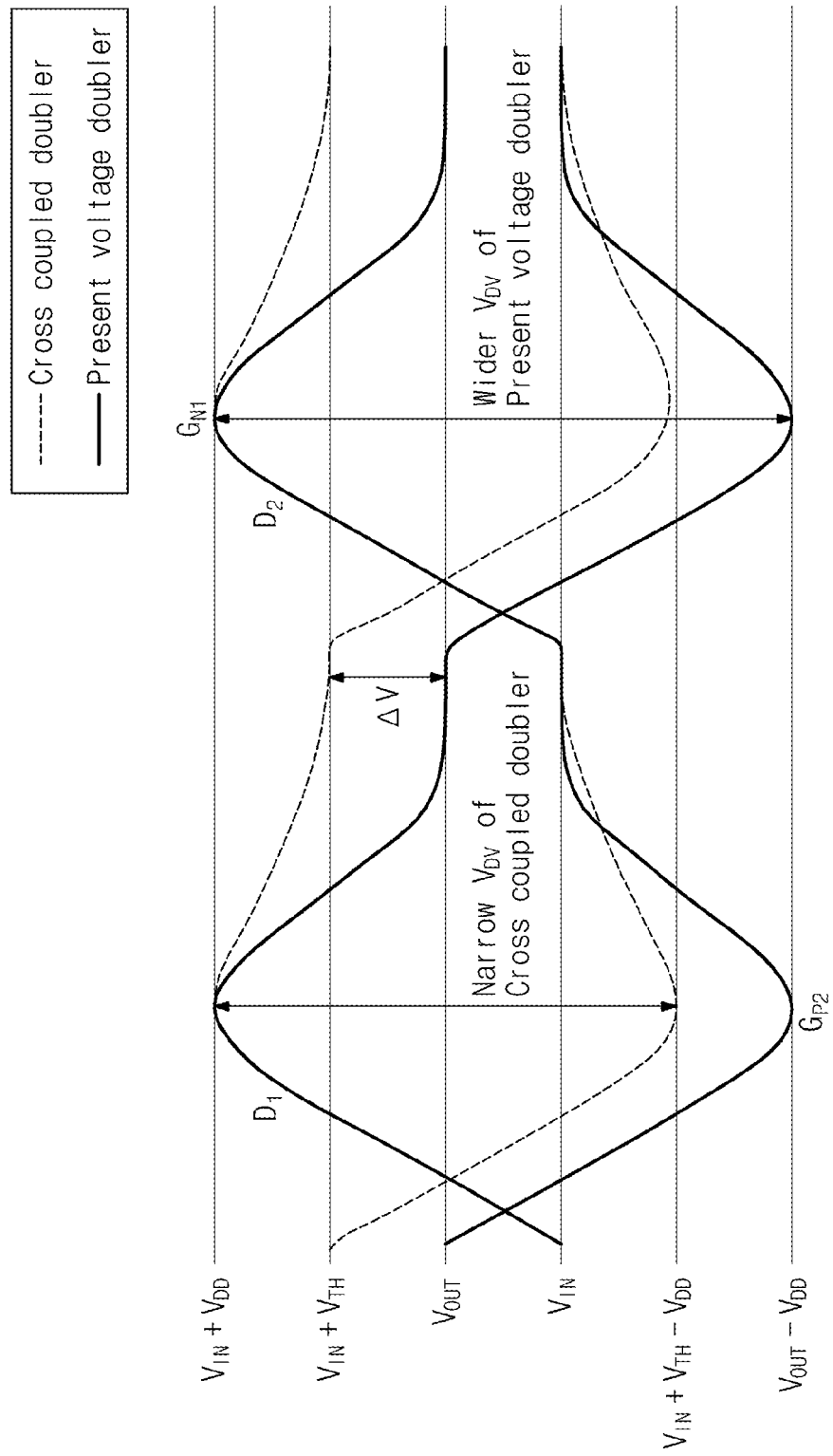
FIG. 6 is a diagram for comparing a voltage doubler of the inventive concept and a simple cross-coupled voltage doubler.

FIG. 6 is a diagram for comparing a voltage doubler of the inventive concept and a typical cross-coupled voltage doubler. Referring to FIG. 6, $V_{OUT}$ is forced a value between $V_{IN}$ and ($V_{IN}+V_{TH}$) and node voltages $D_1$ and $D_2$ and node voltages D1 and D2 are plotted for a conventional voltage doubler and a voltage doubler of the inventive concept, respectively. Gate voltages $G_{P2}$ and $G_{N1}$ of a voltage doubler of the inventive concept are also plotted. In case of a conventional voltage doubler, nodes $D_1$ and $D_2$ may not charge $V_{OUT}$ fully due to a drop of a threshold voltage $V_{TH}$. In contrast, the voltage doubler of the inventive concept may not cause the above-described problem. The reason is that the gates $G_{P2}$ and $G_{N1}$ are pulled up to a power supply voltage VDD below $V_{OUT}$ and a power supply voltage VDD above $V_{IN}$.

Meanwhile, a start-up problem may occur at a PMOS cross coupled pair when gates $G_{P1}$ and $G_{P2}$ are not fully reset. However, the inventive concept is implemented to reduce the start-up problem.

Figure 7:
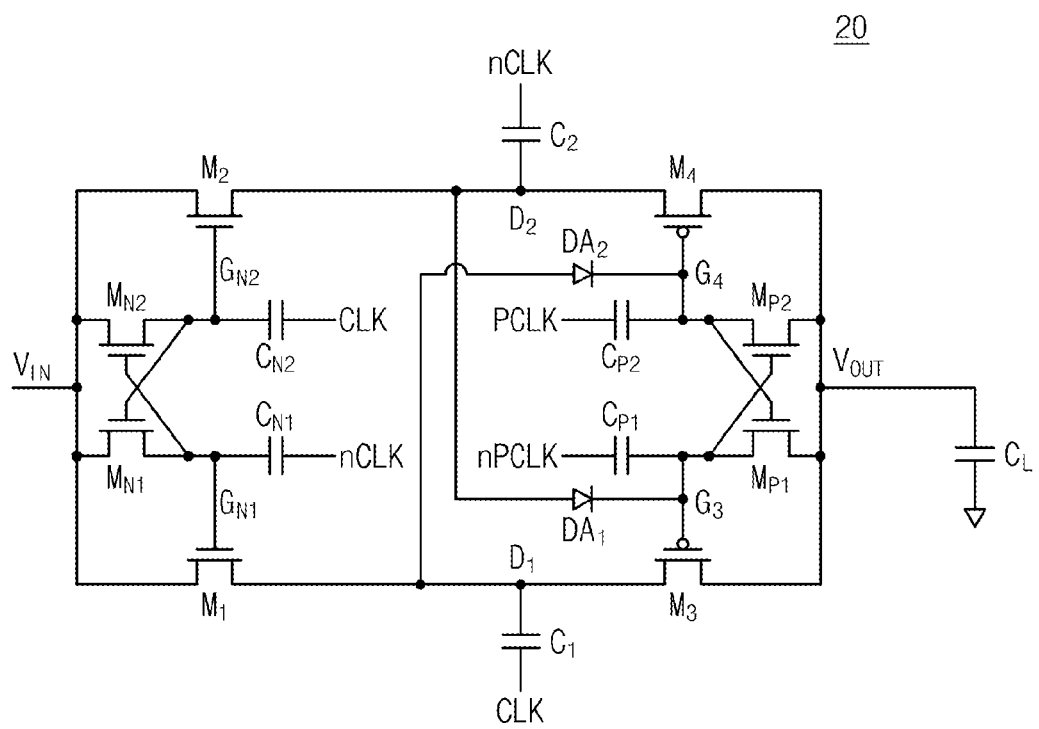
FIG. 7 is a diagram schematically illustrating a voltage doubler according to another embodiment of the inventive concept.

FIG. 7 is a diagram schematically illustrating a voltage doubler according to another embodiment of the inventive concept. Referring to FIG. 7, a voltage doubler 20 is substantially the same as that shown in FIG. 4 except that it further includes a first diode DA1 and a second diode DA2 to fully reset gates $G_3$ and $G_4$ of pass transistors $M_3$ and $M_4$. The first diode DA1 is connected between a node $D_2$ and a gate $G_3$ of a pass transistor $M_3$, and the second diode DA2 is connected between a node $D_1$ and a gate $G_4$ of a pass transistor $M_4$.

An increase in a ramp-up time of a pump unit is directly associated with an area and power savings. A required ramp-up time is achieved with smaller capacitance area and less current. A pump unit of the inventive concept is applicable to a high-voltage pump of a NAND flash memory to improve program and read speeds. Thus, performance of the NAND flash memory may be improved.

Figure 8:
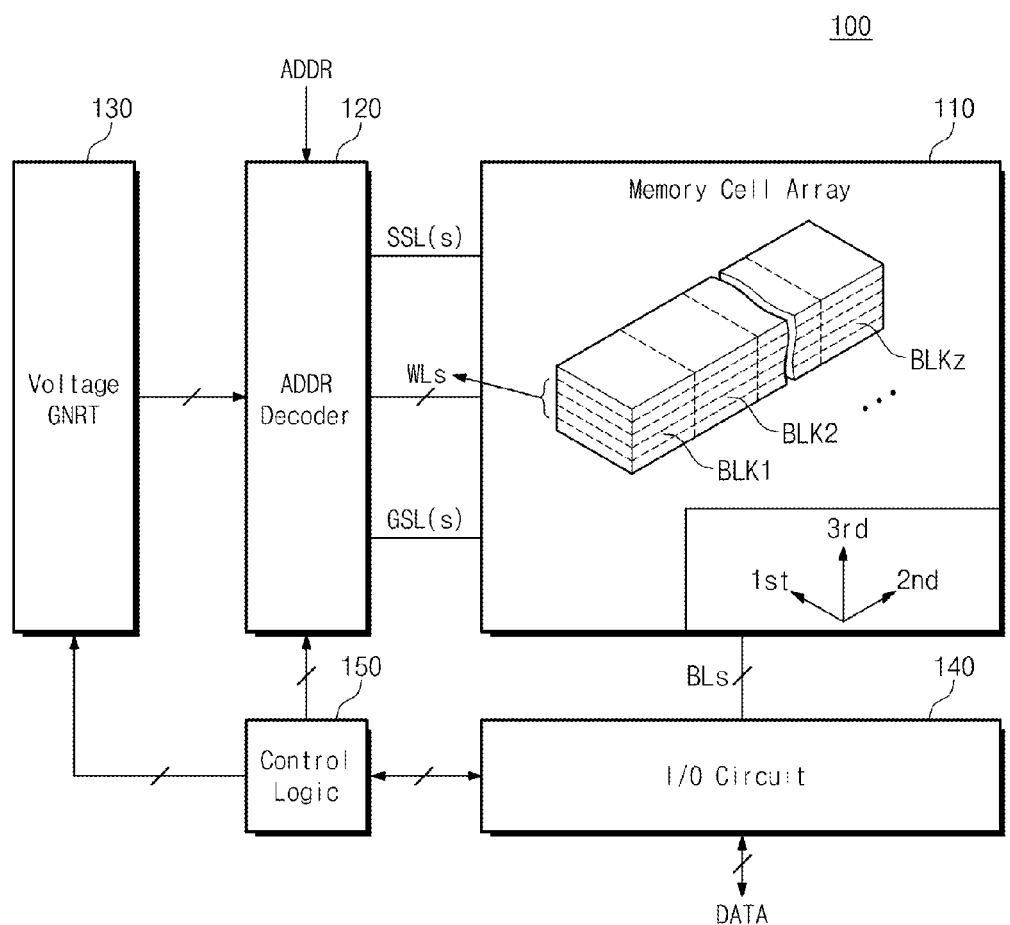
FIG. 8 is a block diagram schematically illustrating a nonvolatile memory device according to an embodiment of the inventive concept.

FIG. 8 is a block diagram schematically illustrating a nonvolatile memory device according to an embodiment of the inventive concept. Referring to FIG. 8, a nonvolatile memory device 100 includes a memory cell array 110, an address decoder 120, a voltage generation circuit 130, an input/output circuit 140, and control logic 150.

The nonvolatile memory device 100 may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device 1000 may be implemented to have a three-dimensional array structure. In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The inventive concept is applicable to a Charge Trap Flash (CTF) memory device, in which a charge storage layer is made up of an insulation film, as well as a flash memory device, in which a charge storage layer is made up of a conductive floating gate.

The memory cell array 110 includes a plurality of memory blocks BLK1 to BLKz (z being an integer of 2 or more), each of which is connected to the address decoder 120 via word lines, at least one string selection line SSL, and at least one ground selection line GSL and to the input/output circuit 140 via bit lines. In exemplary embodiments, the word lines may be formed to have a shape where plates are stacked.

The memory blocks BLK1 to BLKz may include a plurality of strings that are three-dimensionally arranged on a substrate along a first direction and a second direction different from the first direction and along a third direction (i.e., a direction perpendicular to a plane formed in the first and second directions). Herein, each string may contain at least one string selection transistor, a plurality of memory cells, and at least one ground selection transistor connected in series in a direction perpendicular to the substrate. Each memory cell may store one or more bits. In exemplary embodiments, at least one dummy cell may be provided between at least one string selection transistor and a plurality of memory cells. As another example, at least one dummy cell may be provided between a plurality of memory cells and at least one ground selection transistor.

The address decoder 120 selects one of the memory blocks BLK1 to BLKz in response to an address. The address decoder 120 is connected to the memory cell array 110 through the word lines, the at least on string selection line SSL, and the at least one ground selection line GSL. The address decoder 120 selects the word lines, the at least one string selection line SSL, and the at least one ground selection line GSL using a decoded row address. The address decoder 120 decodes a column address of an input address. Herein, the decoded column address may be transferred to the input/output circuit 140. In exemplary embodiments, the address decoder 120 may include, but not limited to, a row decoder, a column decoder, an address buffer, and so on.

The voltage generation circuit 130 generates driving voltages, such as a program voltage, a pass voltage, a read voltage, a read pass voltage, a verification voltage, an erase operation, a common source line voltage, a well voltage, and so on. The voltage generation circuit 130 also generates a word line voltage needed for a program/read/erase operation.

Also, the voltage generation circuit 130 selectively generates a word line voltage with an offset pulse according to a control of the control logic 150. That is, the voltage generation circuit 130 may generate a word line voltage with an offset pulse and an offset-pulse-free word line voltage. The voltage generation circuit 130 may be implemented using a voltage doubler 10 or 20 shown in FIG. 4 or 6.

The input/output circuit 140 is connected to the memory cell array 110 through the bit lines. The input/output circuit 140 is configured to receive the decoded column address from the address decoder 120. The input/output circuit 140 selects the bit lines using the decoded column address.

The input/output circuit 140 may contain a plurality of page buffers that store program data at a program operation and reads data at a read operation. Herein, each of the page buffers may include a plurality of latches. During a program operation, data stored in the page buffers may be programmed at a page of a selected memory block. During a read operation, data read from a page of a selected memory block may be stored in the page buffers via the bit lines. Meanwhile, the input/output circuit 140 reads data from a first area of the memory cell array 110 and then stores the read data in a second area of the memory cell array 110. For example, the input/output circuit 140 is configured to perform a copy-back operation.

The control logic 150 controls an overall operation of the VNAND 100, including, but not limited to, a program operation, a read operation, and an erase operation. The control logic 150 operates in response to control signals or commands that are provided from the external device. The control logic 150 controls the address decoder 120, the voltage generation circuit 130, and the input/output circuit 140 at a program/erase/read operation.

The nonvolatile memory device 100 of the inventive concept may be used as a storage medium such as a memory card (CF, SD, microSD, and so on), SSD, eMMC, UFS, USB storage device, and so on.

A nonvolatile memory device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A voltage doubler comprising:
a first transistor connected between a first node and an input terminal configured to receive an input voltage;
a second transistor connected between the input terminal and a second node;
a third transistor connected between the first node and an output terminal configured to output an output voltage;
a fourth transistor connected between the second node and the output terminal;
a first capacitor connected between the first node and a first clock terminal configured to receive a first clock signal;
a second capacitor connected between the second node and a second clock terminal configured to receive an inverted first clock signal;
a first gate control unit configured to control the first and second transistors using the first clock signal and the inverted first clock signal;
a second gate control unit configured to control the third and fourth transistors using a second clock signal and an inverted second clock signal; and
a load capacitor connected between the output terminal and a ground terminal.

2. The voltage doubler of claim 1, wherein each of the first and second transistors comprises an NMOS transistor and each of the third and fourth transistors comprises a PMOS transistor.

3. The voltage doubler of claim 1, wherein the second clock signal is obtained by delaying the first clock signal by a predetermined time.

4. The voltage doubler of claim 1, wherein the first gate control unit comprises:
first boosting capacitors connected to gates of the first and second transistors and configured to receive the first clock signal and the inverted first clock signal; and
a pair of NMOS transistors cross-coupled between the gates of the first and second transistors and the input terminal.

5. The voltage doubler of claim 1, wherein the second gate control unit comprises:
second boosting capacitors connected to gates of the third and fourth transistors and configured to receive the second clock signal and the inverted second clock signal; and
a pair of PMOS transistors cross-coupled between the gates of the third and fourth transistors and the output terminal.

6. The voltage doubler of claim 1, further comprising:
a first diode connected between the second node and a gate of the third transistor; and
a second diode connected between the first node and a gate of the fourth transistor.

7. A nonvolatile memory device comprising:
a memory cell array including a plurality of memory blocks each formed of a plurality of memory cells;
an address decoder configured to select one of the plurality of memory blocks;
a voltage generation circuit configured to provide a word line voltage to word lines of the selected memory block;
an input/output circuit configured to store page data to be programmed at a selected page of the selected memory block at a program operation and store data read from the selected page of the selected memory block at a read operation; and
a control circuit configured to control the address decoder, the voltage generation circuit, and the input/output circuit;
wherein the voltage generation circuit comprises a voltage doubler including
a first transistor connected between a first node and an input terminal configured to receive an input voltage,
a second transistor connected between the input terminal and a second node,
a third transistor connected between the first node and an output terminal configured to output an output voltage,
a fourth transistor connected between the second node and the output terminal,
a first capacitor connected between the first node and a first clock terminal configured to receive a first clock signal,
a second capacitor connected between the second node and a second clock terminal configured to receive an inverted first clock signal,
a first gate control unit configured to control the first and second transistors using the first clock signal and the inverted first clock signal,
a second gate control unit configured to control the third and fourth transistors using a second clock signal and an inverted second clock signal, and
a load capacitor connected between the output terminal and a ground terminal.

8. The nonvolatile memory device of claim 7, wherein each of the memory blocks includes strings formed between a common source line and bit lines and in a direction perpendicular to a substrate.

9. The nonvolatile memory device of claim 8, wherein word lines and/or the bit lines are shared between levels.

10. The nonvolatile memory device of claim 7, wherein the first gate control unit comprises:
first boosting capacitors connected to gates of the first and second transistors and configured to receive the first clock signal and the inverted first clock signal; and
a pair of NMOS transistors cross-coupled between the gates of the first and second transistors and the input terminal.

11. The nonvolatile memory device of claim 7, wherein the second gate control unit comprises:
   second boosting capacitors connected to gates of the third and fourth transistors and configured to receive the second clock signal and the inverted second clock signal; and
   a pair of PMOS transistors cross-coupled between the gates of the third and fourth transistors and the output terminal.

12. The nonvolatile memory device of claim 7, wherein the voltage doubler further comprises:
   a first diode connected between the second node and a gate of the third transistor; and
   a second diode connected between the first node and a gate of the fourth transistor.

13. The nonvolatile memory device of claim 7, wherein the second clock signal is obtained by delaying the first clock signal by a predetermined time.

14. The nonvolatile memory device of claim 7, wherein each of the memory cells includes a charge trap layer.

15. A method of making a voltage doubler, the method comprising:
   connecting a first transistor between a first node and an input terminal configured to receive an input voltage;
   connecting a second transistor between the input terminal and a second node;
   connecting a third transistor between the first node and an output terminal configured to output an output voltage;
   connecting a fourth transistor between the second node and the output terminal;
   connecting a first capacitor between the first node and a first clock terminal configured to receive a first clock signal;
   connecting a second capacitor between the second node and a second clock terminal configured to receive an inverted first clock signal;
   providing a first gate control unit to control the first and second transistors using the first clock signal and the inverted first clock signal;
   providing a second gate control unit to control the third and fourth transistors using a second clock signal and an inverted second clock signal; and
   connecting a load capacitor between the output terminal and a ground terminal.

16. The method of claim 15, wherein each of the first and second transistors comprises an NMOS transistor and each of the third and fourth transistors comprises a PMOS transistor.

17. The method of claim 15, wherein the second clock signal is obtained by delaying the first clock signal by a predetermined time.

18. The method of claim 15, wherein providing the first gate control unit comprises:
   connecting first boosting capacitors to gates of the first and second transistors and configured to receive the first clock signal and the inverted first clock signal; and
   cross-coupling a pair of NMOS transistors between the gates of the first and second transistors and the input terminal.

19. The method of claim 15, wherein providing the second gate control unit comprises:
   connecting second boosting capacitors to gates of the third and fourth transistors and configured to receive the second clock signal and the inverted second clock signal; and
   cross-coupling a pair of PMOS transistors between the gates of the third and fourth transistors and the output terminal.

20. The method of claim 15, further comprising:
   connecting a first diode between the second node and a gate of the third transistor; and
   connecting a second diode between the first node and a gate of the fourth transistor.

* * * * *